US009832739B2

(12) United States Patent
Terry (10) Patent No.: US 9,832,739 B2
(45) Date of Patent: Nov. 28, 2017

(54) SYSTEM AND METHOD FOR CALIBRATION OF A DISTRIBUTED AMPLIFIER SYSTEM

(71) Applicant: Zone Access Technologies, Inc., Duluth, GA (US)

(72) Inventor: Scott Terry, Pleasanton, CA (US)

(73) Assignee: WHOOP WIRELESS LLC, Fort Lauderdale, FL (US)

( * ) Notice: Subject to any disclaimer, the term of this patent is extended or adjusted under 35 U.S.C. 154(b) by 341 days.

(21) Appl. No.: 14/149,824

(22) Filed: Jan. 8, 2014

(65) Prior Publication Data

US 2014/0194135 A1    Jul. 10, 2014

Related U.S. Application Data

(60) Provisional application No. 61/749,922, filed on Jan. 8, 2013.

(51) Int. Cl.

| H04W 24/10 | (2009.01) |
|---|---|
| H04W 52/24 | (2009.01) |
| H04W 24/08 | (2009.01) |
| H04W 16/26 | (2009.01) |
| H04W 24/02 | (2009.01) |
| H03G 3/20 | (2006.01) |
| H04B 1/16 | (2006.01) |
| H04W 52/52 | (2009.01) |
| H04W 88/08 | (2009.01) |

(52) U.S. Cl.
CPC ............ H04W 52/245 (2013.01); H03G 3/20 (2013.01); H04B 1/16 (2013.01); H04W 16/26 (2013.01); H04W 24/02 (2013.01); H04W 24/08 (2013.01); H04W 24/10 (2013.01); H04W 52/52 (2013.01); H04W 88/085 (2013.01)

(58) Field of Classification Search
CPC .. H04W 52/146; H04W 52/52; H04W 88/085
USPC ....................................... 455/452.2
See application file for complete search history.

(56) References Cited

U.S. PATENT DOCUMENTS

| 4,730,302 | A | * | 3/1988 | Fuerlinger | F16L 23/02 370/250 |
|---|---|---|---|---|---|
| 5,526,348 | A | * | 6/1996 | Ichiyoshi | H04B 7/2123 370/281 |
| 5,752,164 | A | | 5/1998 | Jones | |
| 6,349,200 | B1 | | 2/2002 | Sabat, Jr. et al. | |
| 7,009,573 | B2 | | 3/2006 | Hornsby et al. | |
| 7,082,320 | B2 | | 7/2006 | Kattukaran et al. | |

(Continued)

FOREIGN PATENT DOCUMENTS

| CN | 102438255 A | 12/2011 |
|---|---|---|
| CN | 101842995 B | 6/2013 |
| CN | 103384385 A | 11/2013 |
| EP | 0196098 B1 | 5/1992 |
| EP | 0442259 B1 | 7/1994 |

*Primary Examiner* — Lester Kincaid
*Assistant Examiner* — Gary Lafontant
(74) *Attorney, Agent, or Firm* — Perkins Coie LLP (57) ABSTRACT

A system and method in a distributed amplifier system for correcting for RF losses between head end and coverage nodes by measuring RF losses in both directions; generating gains for amplifiers in both the head ends and coverage nodes; generating maximum output power limits; and adjusting the generated gains and output power limits based on downlink signal strength of cellular signals at a donor antenna.

16 Claims, 4 Drawing Sheets

(56) References Cited

U.S. PATENT DOCUMENTS

| | | |
|---|---|---|
| 7,764,924 B1 | 7/2010 | Smithey et al. |
| 7,787,900 B1 | 8/2010 | Raissinia et al. |
| 8,085,869 B2 | 12/2011 | Behzad |
| 8,219,074 B2 | 7/2012 | Lindgren et al. |
| 8,254,848 B1 | 8/2012 | Elliott et al. |
| 8,284,713 B2 | 10/2012 | Asati et al. |
| 8,442,515 B2 | 5/2013 | Stump et al. |
| 8,532,492 B2 | 9/2013 | Palanisamy et al. |
| 8,532,580 B2 | 9/2013 | Elliott et al. |
| 8,619,847 B1 | 12/2013 | Anvari |
| 2006/0019604 A1 | 1/2006 | Hasarchi |
| 2008/0174502 A1 | 7/2008 | Oren et al. |
| 2011/0150050 A1 | 6/2011 | Trigui et al. |
| 2012/0287978 A1 | 11/2012 | O'Keeffe et al. |
| 2013/0109420 A1 | 5/2013 | Nilsson et al. |
| 2013/0237158 A1 | 9/2013 | Moe et al. |

FOREIGN PATENT DOCUMENTS

| | | | |
|---|---|---|---|
| EP | 0750405 A2 | 12/1996 | |
| EP | 1071160 A2 | 1/2001 | |
| EP | 2159933 A1 | 8/2008 | |
| EP | 2159933 A1 | 3/2010 | |
| EP | 2533433 A2 | 12/2012 | |
| EP | 2587677 A1 | 5/2013 | |
| FR | EP 2159933 B1 * | 3/2013 | .......... H04W 88/085 |
| WO | 9428690 A1 | 12/1994 | |
| WO | 9900906 A2 | 1/1999 | |
| WO | 2007044595 A2 | 4/2007 | |
| WO | 2009155602 A1 | 12/2009 | |
| WO | 2010124297 A1 | 10/2010 | |
| WO | 2012024345 A2 | 8/2011 | |
| WO | 2011156465 A1 | 12/2011 | |
| WO | WO 2011156465 A1 * | 12/2011 | .......... H04W 52/146 |
| WO | 2012138769 A1 | 10/2012 | |

* cited by examiner

SYSTEM AND METHOD FOR CALIBRATION OF A DISTRIBUTED AMPLIFIER SYSTEM

CROSS-REFERENCE TO RELATED APPLICATION(S)

The present application claims the benefit of and incorporates by reference U.S. provisional application No. 61/749,922, entitled "Intelligent Distributed Amplifier System," which was filed on Jan. 8, 2013.

TECHNICAL FIELD

The present disclosure relates to a telecommunication system, and more particularly, but not exclusively to a system and method for calibrating a distributed amplifier system.

BACKGROUND

In conventional telecommunication systems, RF losses between a head end and nodes of a system will decrease performance of the system. Further, these RF losses can vary over time. Accordingly, a new system and method may be needed to calibrate the system over time to compensate for the RF losses.

SUMMARY OF THE INVENTION

In an embodiment, a method comprises measuring RF losses at multiple frequencies in both a first directions between a head end and a coverage node in a site by measuring output power from the head end and comparing that to input power on a plurality of coverage nodes as received from the coverage nodes for downlink loss and vice-versa for uplink loss; generating gains and output power limits for each amplifier in each coverage node and the head end based on the measured RF losses; and further adjusting the generated gains and output power limits based on downlink signal strength of cellular signals at a donor antenna.

In an embodiment, a distributed amplifier system comprises a head end and a plurality of coverage nodes distributed in a site and communicatively coupled to the head end. Each coverage node includes an amplifier and the head end includes an amplifier. The head end amplifier is configured to measure RF losses at multiple frequencies in a first direction between the head end and the coverage nodes by measuring output power from the head end and comparing that to input power on a plurality of coverage nodes as received from the coverage nodes for downlink loss;

generate gains and output power limits for each amplifier in each coverage node and the head end based on the measured RF losses; and further adjust the generated gains and output power limits based on downlink signal strength of cellular signals at a donor antenna.

BRIEF DESCRIPTION OF THE DRAWINGS

The present invention is illustrated in an exemplary manner by the accompanying drawings. The drawings should be understood as exemplary rather than limiting, as the scope of the invention is defined by the claims. In the drawings, like references indicate similar elements.

DETAILED DESCRIPTION

Figure 1:
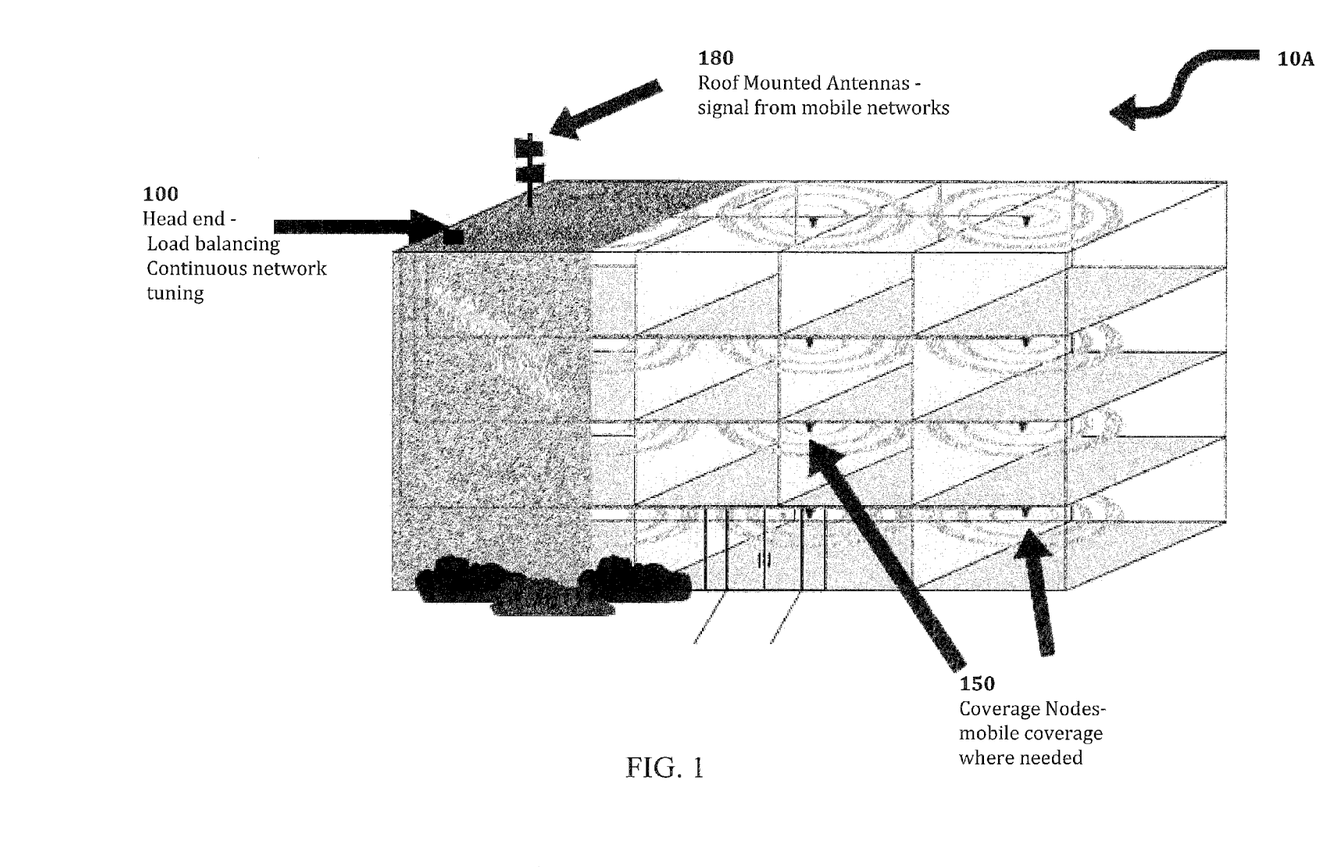
FIG. 1 is a diagram illustrating a deployment of distributed amplifier system.

FIG. 1 is a diagram illustrating a deployment of a distributed amplifier system 10A. The cellular signals from outdoor cellular towers may not provide clear and consistent coverage inside buildings, so wireless operators and building owners use distributed antenna systems 10A to broadcast cellular signals throughout their facilities. The communications signals are distributed throughout building interiors, campus environments, and outdoor areas using an active Distributed Amplifier System. The DAS is active because it uses signal amplifiers to add gain to communications radio frequency (RF) signals. This gain also facilitates penetration of the signals throughout a building, campus environment, or outdoor areas despite physical obstructions such as walls, interior structures, poles, and trees without loss of signal integrity.

The distributed amplifier system comprises a head end 100, a plurality of coverage nodes 150 and roof mounted antenna(s) 180. The distributed amplifier systems work by distributing wireless signals throughout an interior space: the signal is typically brought to the building using roof-mounted antennas 180 or with a base station (BTS) installed in a telecommunications equipment room. The antennas 180 or BTS is then connected to the DAS using coaxial cabling, fiber optics, or other wired or wireless connection mechanism. The DAS network of coverage nodes 150 is placed strategically throughout the building using cable, fiber optics or other connection mechanism. The DAS works with multiple coverage nodes 150 strategically placed within the building to provide reliable text messaging, data, and voice communications. All coverage nodes 150 in the system may be networked together to deliver a balanced and reliable signal throughout the site. The head end unit 100 manages all of the coverage nodes 150 in the DAS system along with local and remote access for monitoring and status checking. Alternatively, management may be distributed across the network.

Alternatively, the DAS system can be installed in any site, which may include tunnels, fields, sports stadiums, subway or railway stations, buses, or subways, etc. in addition to the building shown in FIG. 1.

Figure 2:
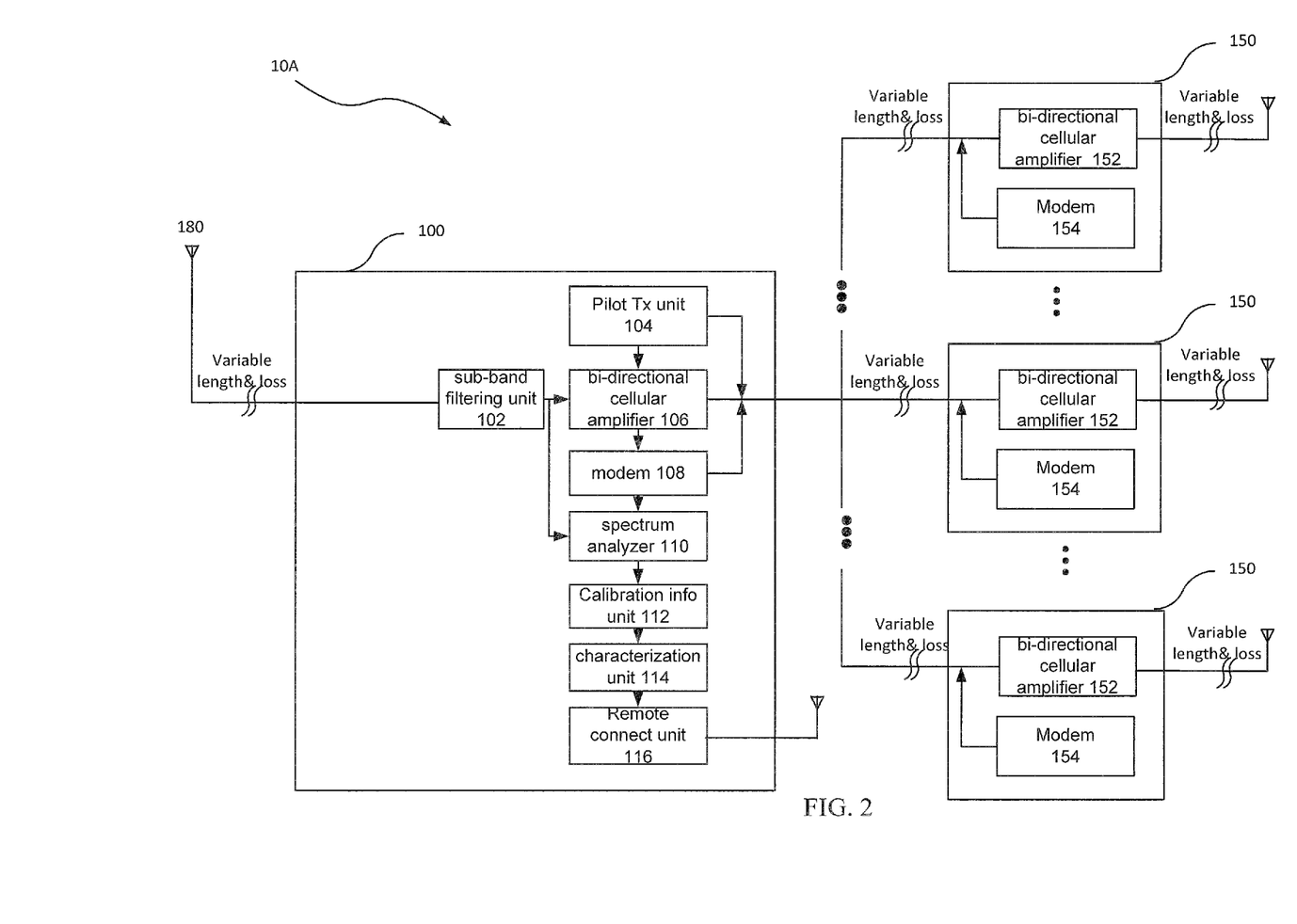
FIG. 2 is a block diagram illustrating a detailed embodiment of the distributed amplifier system of FIG. 1.

FIG. 2 is a block diagram illustrating a detailed embodiment of the distributed amplifier system 10A shown in FIG. 1A. A distributed amplifier system 10A shown in FIG. 2 comprises a head end 100 and a plurality of coverage nodes 150. The head end 100 comprises a sub-band filtering unit 102, a Pilot Tx unit 104, a bi-directional cellular amplifier 106, a modem 108, a spectrum analyzer 110, a calibration info unit 112, a characterization unit 114, and a remote connect unit 116.

The directional control unit 102 controls at least direction of at least one antenna 180 communicatively coupled to the head end 100. The sub-band filtering unit 102 is communicatively coupled to the antenna 180 and filters sub-band signals. The bi-directional cellular amplifier 106 is communicatively coupled to the sub-band filtering unit 102 and amplifies the filtered sub-band signals. While only one amplifier 106 is shown, in an embodiment of the invention, there are multiple amplifiers to amplify different frequencies. Further, while the amplifier 106 is referred to as a cellular amplifier, it can also amplify other signals, such as WiFi, WiMax, etc. In an embodiment, the amplifier 106 may include one or more single direction amplifiers.

The bi-directional cellular amplifier 106 is also communicatively coupled to the pilot Tx unit 104, so that the bi-directional cellular amplifier 106 can obtain pilot information from the pilot Tx unit 104. The amplifier 106 includes a power detector that measures the output power in each band. The bi-directional cellular amplifier 106 is communicatively coupled to the sub-band filtering unit 102, so that the filtered signals are delivered to the amplifier 106. The modem 108 is part of an internal network for access and control of the DAS. To be more specific, the modem 108 is a communication device that talks to all of the remote nodes including but not limited to modems 154. The spectrum analyzer 110 is communicatively coupled to the bi-directional cellular amplifier 106 and analyzes spectrum of the signals outputted and received by the modem 108. The calibration information unit 112 is communicatively coupled to the spectrum analyzer 110 and collects calibration information from the spectrum analyzer 110. The calibration info unit 112 is where all of the calibration information for all nodes and the head end are stored. This information is used by the characterization unit 114 to determine if the environment has changed. The characterization unit 114 is communicatively connected to the calibration information unit 112 and observes the way the unit is calibrated and then monitors the entire DAS system to determine if local conditions change ever change, thereby requiring recalibration. The characterization unit 114 can be used to trigger trouble shooting in the system.

Local conditions often evolve over time due to several factors: 1) the source RF signal network configuration changes (due, for example, to changes effected by cellular, Wi-Fi, or public safety network operators); 2) the RF environment changes (due, for example, to metal surfaces or objects placed near antennas, new walls constructed, new window coatings applied, or seasonal and weather changes); or 3) a component failure or similar performance reduction in part of the DAS.

The remote connect unit 116 is communicatively connected to the characterization unit 114 and transmits remote connect information through the antenna 180. When a DAS is installed, the installer will verify that all communications RF signals are being distributed sufficiently throughout the target coverage area. However, when the installation is complete, the system is left to run on its own. Users of the DAS may discover that the communications RF signals have degraded over time. It may be that some or all users are finding reduced performance. Since the communications systems (for example, cellular, Wi-Fi, public safety, or other wireless networks) can change over time, and since the possibility of equipment failure within the DAS exists, communication signals may not be distributed properly.

To ensure consistent performance of the DAS, remote monitoring is used allowing the review and control of all system equipment and components. The remote access is performed via several mediums, including but not limited to TCP over cellular or Wi-Fi. The DAS supports internal communication to all amplifiers and active devices in the system; and the remote connection is only needed to connect to one piece of equipment in the DAS to allow communications to all components of the system. Once a remote connection is made, a set of self-monitoring alarms are enabled in the DAS, which trigger the DAS to actively contact the assigned entity or monitoring station with an issue or alarm condition via the remote connect unit 116. By monitoring the system internally, the DAS will notify the system management team or other interested party when it is not operating effectively.

One method of detecting problems in the system is to characterize the system after it is initially installed and periodically afterwards with the characterization unit 114. This characterization includes the levels of the communication network operators' source signals throughout the DAS and at the point of each antenna, and the calibration results of the system when measuring the RF losses throughout the DAS and also includes measuring the antenna feedback results. The DAS will then self-monitor this characterization and trigger an alarm if the characterization has changed. In addition, when a user of the DAS issues a complaint that the system is not working, remote monitoring will allow access to the DAS to run the characterization check and verify proper operation.

Remote monitoring works for more than just examining the DAS after installation. The installation itself will benefit substantially from remote monitoring. Since DAS installations often involve third party installation operators, the level of DAS knowledge of the installers is often lacking. This can lead to problems with the installations and increase cost significantly due to repeated visits to the site to correct common problems. Instead, the remote monitoring is used during the installation to allow experts in DAS installation to examine each step of the installation to ensure proper set-up and optimization of the system.

The Pilot Tx unit 104 generates a pilot and sends the pilot to the bi-directional cellular amplifier 106.

Each of the coverage node 150 comprises a bi-directional cellular amplifier 152 and a modem 154. The bi-directional cellular amplifier 152 is communicatively coupled to the modem 154. Each of the amplifiers 152 have a power detector that measures the output power in each band. The uplink and downlink signals are amplified by the bi-directional cellular amplifier 152. Note that while only one amplifier 152 is shown per node, there can be a plurality of amplifiers 152 to amplify different signals. Further, while the amplifier 152 is referred to as a cellular amplifier, it can amplify other signals, such as WiFi, WiMax, etc. The amplifier 152 can also comprise one or more single direction amplifiers. The head end 100 and each of the coverage nodes 150 are connected by coaxial cable or other connection mechanism.

Each of the various modules shown in FIG. 2 (e.g., Calibration info unit 112) can be implemented in pure hardware (e.g., specially-designed dedicated circuitry such as one or more application-specific integrated circuits (ASICs)), or in programmable circuitry appropriately programmed with software and/or firmware, or in a combination of pure hardware and programmable circuitry.

During operation the DAS 10A performs a calibration that measures the RF loss between each amplifier for each RF path. Then, based on these losses, the gain for each RF path on all amplifiers is set optimally. The DAS 10A enables management of gain settings to ensure: 1) the input power for each amplifier is not exceeded; 2) the output power for each amplifier is not exceeded; 3) the RF levels are never degraded to a level that impacts the RF signal quality (e.g., noise figure); and 4) there is sufficient margin on each of these parameters to enable the DAS 10A to change dynamically while avoiding conditions that cause RF signal degradation or distortion.

Added to the calibration of the DAS 10A is the type of antenna used, the cable type, and the length of the RF cable going to each antenna. The RF gain and losses of each of these components are included in the algorithm for determining the optimal configuration of the amplifiers. This calibration information can be programmed into the DAS 10A into the Calibration Info Unit 112 an/or determined by the DAS 10A.

In an embodiment the characterization and calibration of the system is not only for the internal amplifiers, cables, and antennas, but also includes the location of the antennas relative to each other. The DAS 10A determines how each antenna interacts with the others to prevent signal distortion and multi-path conflicts. To accomplish this, the Pilot Tx unit 104 transmits a test signal ("pilot") in the calibration procedure to determine the over-the-air signal separation of each of the antennas. This relationship affects how much power can be output from each antenna and how much net system gain is allowed through each of the antennas. The pilot signal is transmitted to one coverage node 150 at a time, which results in this pilot signal being transmitted out of a single coverage antenna. The other coverage units 150 measure this signal to determine proximity to this antenna, and thus determine if the antennas will interfere with each other.

The Pilot Tx unit 104 sends a pilot signal to the nodes 150. Each node 150 reports back the input power to the node module 220, which calculates RF loss on the downlink based on the difference between output power from the head end 100 and the input power at each node across various frequencies (e.g., cellular, WiFi, etc.). The head end module 230 operates in reverse to determine RF loss on the uplink from the nodes 150 to the head end 100. In an embodiment, the reverse may only be performed for bands that have significant frequency separation between uplink and downlink (such as the AWS band) and therefore may have different RF loss in different directions. The calibration info unit 112 stores the calculated RF losses, which will be discussed in more detail in conjunction with FIG. 3. The amplifiers 106 and 152 then set their respective gains to compensate for RF loss.

Figure 3:
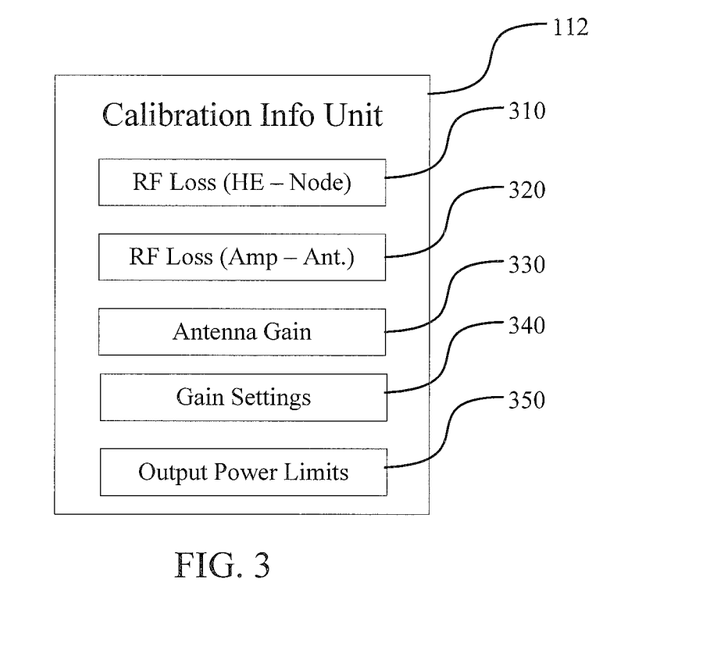
FIG. 3 is a block diagram illustrating the Calibration Info Unit of FIG. 2.

FIG. 3 is a block diagram illustrating the calibration info unit 112. The unit 112 stores data relating to RF loss 310 and 320, antenna gain 330, and gain settings 340 for the amplifiers 106 and 152. This data is stored/updated in the unit 112. The unit 112 may also include output power limits 350, which are the limits for input power to each amplifier 106 and 152. That is, the gain settings 340 cannot exceed a level that would cause input power at each amplifier to exceed input power limits 350.

The following is an example of the calibration for the system. First, the RF losses at each frequency from the Head End System Controller (Head End) to the Coverage Nodes is measured in both directions by measuring the output power from the Head End and comparing that to the input power on the Coverage Node for the downlink cable loss, and vice-versa for the uplink cable loss.

RF loss from Head End to Coverage Node 1:
Cellular downlink (869-895 MHz)=47 dB
Cellular uplink (824-849 MHz)=45 dB
PCS downlink (1930-1990 MHz)=58 dB
PCS uplink (1850-1910 MHz)=54 dB
RF loss from Head End to Coverage Node 2:
Cellular downlink (869-895 MHz)=23 dB
Cellular uplink (824-849 MHz)=20 dB
PCS downlink (1930-1990 MHz)=35 dB
PCS uplink (1850-1910 MHz)=33 dB
RF loss from Head End to Coverage Node 3:
Cellular downlink (869-895 MHz)=51 dB
Cellular uplink (824-849 MHz)=49 dB
PCS downlink (1930-1990 MHz)=60 dB
PCS uplink (1850-1910 MHz)=58 dB
RF loss from Head End to Coverage Node 4:
Cellular downlink (869-895 MHz)=41 dB
Cellular uplink (824-849 MHz)=40 dB
PCS downlink (1930-1990 MHz)=46 dB
PCS uplink (1850-1910 MHz)=45 dB In addition, the RF loss from the amplifier to each of the antennas is calculated from the material used to install each antenna (for example, the cable type, cable length, and splitters used), and the gain of each antenna is determined from the antenna specification.

Donor antenna for the Head End:
Cellular RF loss=4 dB
Cellular antenna gain=9 dBi
PCS RF loss=5 dB
PCS antenna gain=7 dBi
Coverage antenna for Coverage Node 1:
Cellular RF loss=2 dB
Cellular antenna gain=4 dBi
PCS RF loss=2 dB
PCS antenna gain=3 dBi
Coverage antenna for Coverage Node 2:
Cellular RF loss=8 dB
Cellular antenna gain=4 dBi
PCS RF loss=10 dB
PCS antenna gain=3 dBi
Coverage antenna for Coverage Node 3:
Cellular RF loss=0 dB
Cellular antenna gain=4 dBi
PCS RF loss=0 dB
PCS antenna gain=3 dBi
Coverage antenna for Coverage Node 4:
Cellular RF loss=3 dB
Cellular antenna gain=4 dBi
PCS RF loss=4 dB
PCS antenna gain=3 dBi From this calibrated and calculated information, the proper gains and output power limits can be determined for each Coverage Node. These settings will be dependent on the gain of each amplifier and the desired output power for each antenna.

An example of this calculation is as follows:
Head End amplifier gain=70 dB
Coverage Node amplifier gain=70 dB
Desired output power in coverage antenna (downlink)=+13 dBm
Desired output power in donor antenna (uplink)=+20 dBm Finally, the downlink (DL) signal strength of cellular and PCS measured at the donor antenna will determine the final configuration (these signal strengths can be measured at the Head End by using the net gain of the cable and donor antenna).

The settings will be as follows:
If −65 dBm cellular and −75 dBm PCS is measured at the donor antenna:
Cellular:
Maximum DL output of Head End=−65+9−4+70=+10 dBm
Maximum DL output of antenna for Coverage Node 1=+10−47+70−2+4=+35 dBm
Maximum DL output of antenna for Coverage Node 2=+10−23+70−8+4=+53 dBm Maximum DL output of antenna for Coverage Node 3=+10−51+70−0+4=+33 dBm
Maximum DL output of antenna for Coverage Node 4=+10−41+70−3+4=+40 dBm
Final Gain Settings:
Head End cellular gain setting=65 dB
Coverage Node 1 cellular gain setting=43 dB
Coverage Node 2 cellular gain setting=25 dB
Coverage Node 3 cellular gain setting=45 dB
Coverage Node 4 cellular gain setting=38 dB
PCS:
Maximum DL output of Head End=−70+7−5+70=+2 dBm
Maximum DL output of antenna for Coverage Node 1=+2−58+70−2+3=+15 dBm
Maximum DL output of antenna for Coverage Node 2=+2−35+70−10+3=+30 dBm
Maximum DL output of antenna for Coverage Node 3=+2−60+70−0+3=+15 dBm
Maximum DL output of antenna for Coverage Node 4=+2−46+70−4+3=+25 dBm
Final Gain Settings:
Head End PCS gain setting=70 dB
Coverage Node 1 PCS gain setting=68 dB
Coverage Node 2 PCS gain setting=53 dB
Coverage Node 3 PCS gain setting=68 dB
Coverage Node 4 PCS gain setting=58 dB The above results allow for maximum margin so that any short-term changes in the RF conditions will still operate within the range of the amplifiers. If the RF conditions change outside of the range, then the calibration will be performed again. The characterization unit 114 will determine a change outside of margins (e.g., 10 dB) and cause the spectrum analyzer to recalculate RF losses, etc. and adjust gains to compensate.

This system calibration is key to delivering an effective DAS that is easy to install (i.e., the settings are all automated) and the system maintains optimal operation over time. Alternatively, the remote connect unit 116 can notify an operator to manually adjust settings when the characterization unit 114 determines a change.

Figure 4:
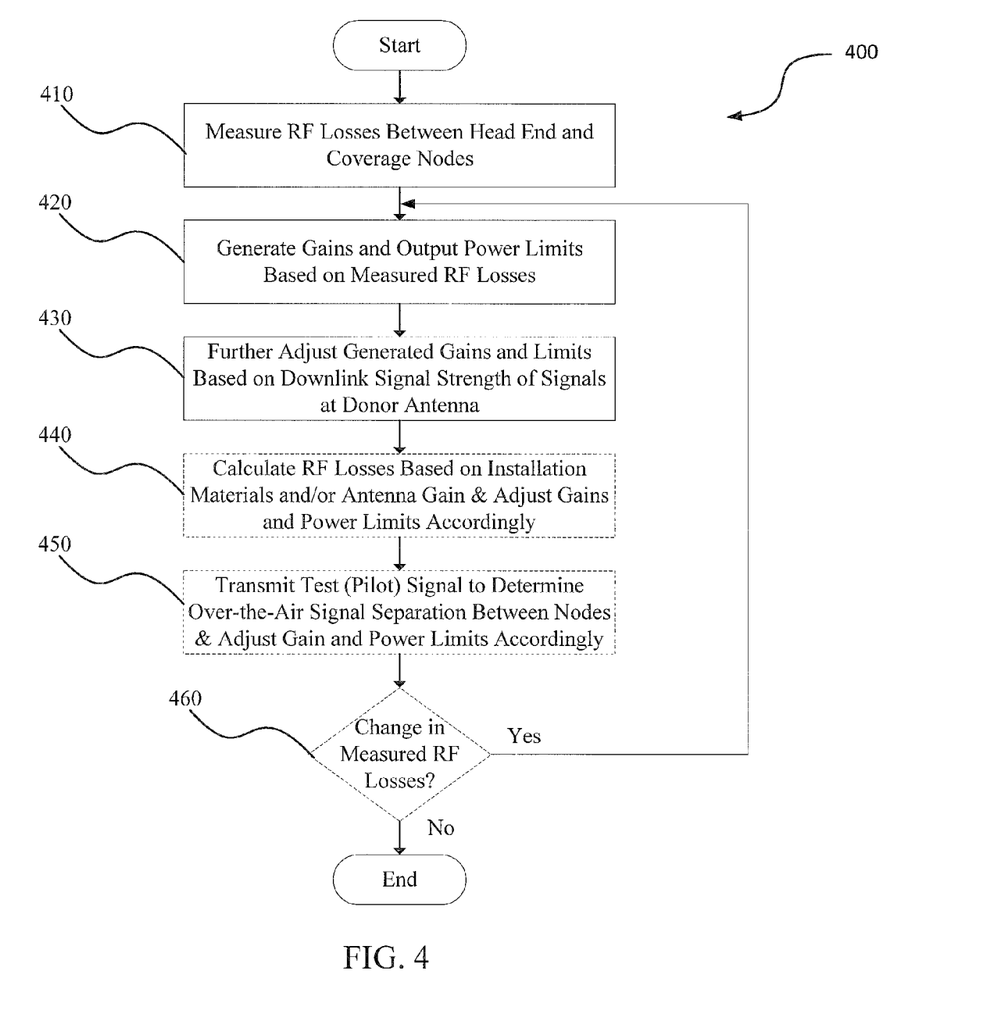
FIG. 4 is a flow chart illustrating an embodiment of a method.

FIG. 4 is a flowchart illustrating a method 400 according to an embodiment. First, RF Losses are measured (410) in both directions between head end and coverage nodes. Then, gain and output power limits are generated (420) and optionally stored in the calibration info unit 112 based on the measurements. The gains and power limits can be further adjusted (430) based on downlink signal of signals at the donor antenna if needed. The unit 112 can also be updated accordingly. In an embodiment, the method 400 further comprises calculating (440) RF losses based on installation materials and/or antenna gain & adjusting gains and power limits accordingly. The unit 112 can also be updated accordingly.

In an embodiment, the method 400 further comprises transmitting (450) a test (Pilot) signal to determine over-the-air signal separation between nodes and adjusting gain and power limits accordingly. The unit 112 can also be updated accordingly.

In an embodiment, the method 400 further comprises monitoring (460) changes in measured RF losses. The characterization unit 114 can cause the pilot Tx unit 104 to transmit signals to the nodes 150 and vice versa. The characterization unit 114 can then compare RF losses from a prior characterization with the current characterization and adjust the gains and power limits accordingly. Otherwise, the method 400 ends.

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

From the foregoing, it will be appreciated that specific embodiments of the invention have been described herein for purposes of illustration, but that various modifications may be made without deviating from the scope of the invention. Accordingly, the invention is not limited except as by the appended claims.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Even if certain features are recited in different dependent claims, the present invention also relates to an embodiment comprising these features in common. Any reference signs in the claims should not be construed as limiting the scope.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

I claim:

1. A method, comprising:
    measuring RF losses at multiple frequencies in a first direction between a head end and a coverage node in a site by measuring output power from the head end and comparing that to input power on a plurality of coverage nodes as received from the coverage nodes for downlink loss;
    generating gains and output power limits for each amplifier in each coverage node and the head end based on the measured RF losses;
    further adjusting the generated gains and output power limits based on downlink signal strength of cellular signals at a donor antenna, the type of antenna used, the cable type, and the length of the RF cable going to each antenna;
    monitoring the measured RF losses over time; and
    further adjusting the generated gains and output power limits based on the monitoring.

2. The method of claim 1, further comprising:
    calculating RF loss from each amplifier to each antenna in the system based on antenna installation materials and antenna gain; and further adjusting the generated gains and output power limits for each coverage node based on the calculated RF losses.

3. The method of claim 1, further comprising:
transmitting a test signal to determine over-the-air signal separation between the plurality of coverage nodes; and
further adjusting the generated gains and output power limits based on the determination.

4. The method of claim 1, where the measuring includes measuring RF loss at both a donor antenna in the head end and coverage antennas in the coverage nodes.

5. The method of claim 1, further comprising:
measuring RF losses at multiple frequencies in a second direction between a head end and a coverage node in a site by receiving measured output power from the nodes and comparing that to input power at a head end for uplink loss;
generating gains and output power limits for each amplifier in each coverage node and the head end based on the measured RF losses; and
further adjusting the generated gains and output power limits based on downlink signal strength of cellular signals at a donor antenna.

6. The method of claim 1, wherein the method is performed across the head end and coverage nodes.

7. The method of claim 1, wherein the method is performed at a coverage node.

8. A distributed amplifier system, comprising:
a head end; and
a plurality of coverage nodes distributed in a site and communicatively coupled to the head end;
each coverage node including an amplifier and the head end including an amplifier;
wherein the head end amplifier is configured to
measure RF losses at multiple frequencies in a first direction between the head end and the coverage nodes by measuring output power from the head end and comparing that to input power on a plurality of coverage nodes as received from the coverage nodes for downlink loss;
generate gains and output power limits for each amplifier in each coverage node and the head end based on the measured RF losses;
further adjust the generated gains and output power limits based on downlink signal strength of cellular signals at a donor antenna, the type of antenna used, the cable type, and the length of the RF cable going to each antenna;
a characterization unit configured to monitor the measured RF losses over time and wherein the head end amplifier is further configured to adjust the generated gains and output power limits based on the monitoring.

9. The system of claim 8, wherein the head end amplifier is further configured to:
calculate RF loss from each amplifier to each antenna in the system based on antenna installation materials and antenna gain; and
further adjust the generated gains and output power limits for each coverage node based on the calculated RF losses.

10. The system of claim 8, further comprising a pilot Tx unit configured to:
transmit a test signal to determine over-the-air signal separation between the plurality of coverage nodes; and
wherein the amplifier is further configured to adjust the generated gains and output power limits based on the determination.

11. The system of claim 8, where the measuring includes measuring RF loss at both a donor antenna in the head end and coverage antennas in the coverage nodes.

12. A head end, comprising:
a modem configured to communicatively couple to a plurality of nodes distributed in a site; and
an amplifier;
wherein each coverage node includes an amplifier;
wherein the head end amplifier is configured to
measure RF losses at multiple frequencies in a first direction between the head end and the coverage nodes by measuring output power from the head end and comparing that to input power on a plurality of coverage nodes as received from the coverage nodes via the modem for downlink loss;
generate gains and output power limits for each amplifier in each coverage node and the head end based on the measured RF losses; and
further adjust the generated gains and output power limits based on downlink signal strength of cellular signals at a donor antenna and locations of antennas relative to each other; and
a characterization unit configured to monitor the measured RF losses over time and wherein the head end amplifier is further configured to
adjust the generated gains and output power limits based on the monitoring.

13. The head end of claim 12, wherein the head end amplifier is further configured to:
calculate RF loss from each amplifier to each antenna in the system based on antenna installation materials and antenna gain; and
further adjust the generated gains and output power limits for each coverage node based on the calculated RF losses.

14. The head end of claim 12, further comprising a pilot Tx unit configured to:
transmit a test signal to determine over-the-air signal separation between the plurality of coverage nodes; and
wherein the amplifier is further configured to adjust the generated gains and output power limits based on the determination.

15. The head end of claim 12, where the measuring includes measuring RF loss at both a donor antenna in the head end and coverage antennas in the coverage nodes.

16. A coverage node, comprising:
a modem configured to communicatively couple to a plurality of nodes distributed in a site; and
an amplifier;
wherein amplifier is configured to
measure RF losses at multiple frequencies in a first direction between the head end and the coverage nodes by measuring output power from the head end and comparing that to input power on a plurality of coverage nodes as received from the coverage nodes via the modem for downlink loss;
generate gains and output power limits for each amplifier in each coverage node and the head end based on the measured RF losses; and
further adjust the generated gains and output power limits based on downlink signal strength of cellular signals at a donor antenna and locations of antennas relative to each other.

* * * * *